(12) United States Patent
Wang et al.

(10) Patent No.: US 11,127,804 B2
(45) Date of Patent: Sep. 21, 2021

(54) DISPLAY PANEL, METHOD FOR MANUFACTURING THE SAME AND DISPLAY DEVICE

(71) Applicant: BOE Technology Group Co., Ltd., Beijing (CN)

(72) Inventors: Pinfan Wang, Beijing (CN); Weixin Ma, Beijing (CN); Mingche Hsieh, Beijing (CN); Fangxu Cao, Beijing (CN); Xixi Guo, Beijing (CN); Yu Feng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 39 days.

(21) Appl. No.: 16/512,902

(22) Filed: Jul. 16, 2019

(65) Prior Publication Data

US 2020/0027940 A1 Jan. 23, 2020

(30) Foreign Application Priority Data

Jul. 17, 2018 (CN) .......................... 201810785695.7

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ...... *H01L 27/3262* (2013.01); *H01L 27/3209* (2013.01); *H01L 51/0097* (2013.01); *H01L 51/5237* (2013.01); *H01L 51/56* (2013.01); *H01L 2227/323* (2013.01); *H01L 2251/5338* (2013.01)

(58) Field of Classification Search
CPC ......... H01L 27/3262; H01L 2251/5338; H01L 23/562; H01L 27/3246
See application file for complete search history.

(56) References Cited

U.S. PATENT DOCUMENTS

| 9,799,708 B2 | 10/2017 | Hong et al. |
| 2009/0173529 A1 | 7/2009 | Lee et al. |
| 2014/0021499 A1* | 1/2014 | Jang .................... H01L 27/3244 257/98 |

(Continued)

FOREIGN PATENT DOCUMENTS

| CN | 102629446 A | 8/2012 |
| CN | 104769719 A | 7/2015 |

(Continued)

*Primary Examiner* — Shih Tsun A Chou
(74) *Attorney, Agent, or Firm* — Muncy, Geissler, Olds & Lowe, P.C.

(57) ABSTRACT

Provided are a display panel, a method for manufacturing the same, and a display device. The display panel includes: flexible substrate; multiple thin film transistor structures arranged in an array and on the flexible substrate; and an organic layer located on the multiple thin film transistor structures. Through holes are arranged between adjacent thin film transistor structures, each through hole penetrates the organic layer and the flexible substrate, and the organic layer covers a first surface of at least one thin film transistor structure far away from the flexible substrate, and side surfaces of the at least one thin film transistor structure proximate to the corresponding through holes.

19 Claims, 8 Drawing Sheets

(56) References Cited

U.S. PATENT DOCUMENTS

| | | |
|---|---|---|
| 2014/0125578 A1 | 5/2014 | Zhou |
| 2014/0138637 A1 | 5/2014 | Yang et al. |
| 2016/0104756 A1 | 4/2016 | Lee et al. |
| 2016/0190389 A1 | 6/2016 | Lee et al. |
| 2016/0211483 A1 | 7/2016 | Kwon |
| 2016/0260927 A1 | 9/2016 | Oh et al. |
| 2017/0249886 A1* | 8/2017 | Choi .................. G09G 3/007 |
| 2017/0278920 A1* | 9/2017 | Park .................. H01L 51/5246 |
| 2017/0288168 A1 | 10/2017 | Kim et al. |
| 2018/0212192 A1 | 7/2018 | Jin et al. |
| 2019/0148462 A1* | 5/2019 | Tanaka .................. H01L 51/003 345/76 |

FOREIGN PATENT DOCUMENTS

| | | |
|---|---|---|
| CN | 106450032 A | 2/2017 |
| CN | 107221549 A | 9/2017 |
| CN | 107240596 A | 10/2017 |
| CN | 206610830 U | 11/2017 |
| TW | 200932077 A | 7/2009 |
| WO | WO-2011/008459 A2 | 1/2011 |

\* cited by examiner

DISPLAY PANEL, METHOD FOR MANUFACTURING THE SAME AND DISPLAY DEVICE

CROSS-REFERENCE TO RELATED APPLICATION

The present application claims a priority to Chinese Patent Application No. 201810785695.7 filed on Jul. 17, 2018, the disclosure of which is incorporated in its entirety by reference herein.

TECHNICAL FIELD

The present disclosure relates to the field of display technology, and in particular to a display panel, a method for manufacturing the same, and a display device.

BACKGROUND

An organic light-emitting diode (OLED), also known as an organic electro-luminescent diode, has advantages of self-emission, a wide viewing angle, a high contrast, a low power consumption, a high reaction speed, etc.

OLED display technology is widely used in mobile phones, digital cameras, personal digital assistants, notebook computers, televisions, and the like. Flexible OLED (FOLED) technology based on OLED is intended to realize various functions such as high convenience and folding display.

At present, when an OLED display panel is packaged, a thin film encapsulation (TFE) layer is used to cover elements such as a thin film transistor and a light-emitting layer so as to provide effective protection for the OLED display panel.

SUMMARY

In a first aspect, an embodiment of the present disclosure provides a display panel, and the display panel includes:
a flexible substrate;
a plurality of thin film transistor structures arranged in an array and on the flexible substrate; and
an organic layer located on the plurality of thin film transistor structures,
where through holes are between adjacent ones of the plurality of thin film transistor structures, each of the through holes penetrates the organic layer and the flexible substrate, and the organic layer covers a first surface of at least one of the plurality of thin film transistor structures far away from the flexible substrate, and covers side surfaces of the at least one thin film transistor structure proximate to the corresponding through holes.

In a second aspect, an embodiment of the present disclosure provides a display device, and the display device includes the display panel provided in the first aspect.

In a third aspect, an embodiment of the present disclosure provides a method for manufacturing the display panel provided in the first respect. The method includes:
manufacturing a plurality of thin film transistor structures arranged in an array and on a flexible substrate;
manufacturing an organic layer on the plurality of thin film transistor structures, where the organic layer covers a first surface of at least one of the plurality of thin film transistor structures far away from the flexible substrate; and
forming through holes between adjacent ones of the plurality of thin film transistor structures, where each of the through holes penetrates the organic layer and the flexible substrate, and the organic layer covers side surfaces of the at least one thin film transistor structure proximate to the corresponding through holes.

BRIEF DESCRIPTION OF THE DRAWINGS

In order to explain technical solutions of embodiments of the present disclosure or the prior art more clearly, drawings used in the description of the embodiments will be briefly introduced hereinafter. The drawings in the following description are only some embodiments of the present disclosure. Other drawings can be obtained by those of ordinary skill in the art according to these drawings.

DETAILED DESCRIPTION OF THE EMBODIMENTS

Specific implementations of the present disclosure will be further described hereinafter with reference to accompanying drawings and embodiments.

The following embodiments are intended to illustrate the present disclosure, but not intended to limit the scope of the present disclosure. In the related art, the TFE layer is used to surround elements such as a thin film transistor and a light-emitting layer so as to prevent external water vapor and oxygen from entering the thin film transistor and the light-emitting layer. In order to improve an encapsulation effect, a side surface of the TFE layer is provided with a certain slope so as to increase water and oxygen resistance capability of the side surface of the TFE layer. This encapsulation method requires a large space, thereby the OLED display panel is not able to achieve a high resolution.

Further, bridges and islands are designed in the related art to make a display panel stretchable. Specifically, multiple pixel units on the display panel are respectively manufactured on islands distributed in an array, a bridge is arranged between each two adjacent islands, and pixel units on different islands communicate with each other through a corresponding bridge.

Inventors of the present disclosure have studied the stretchable display panel designed by bridges and islands in the related art, and found that when the display panel is stretched by 3% as a whole, the bridges bear a maximum strain of 2.5%, and the bridges are most easily damaged in the display panel. Therefore, since the stretchable display panel in the related art is subjected to a maximum stress when the bridges is bent, the whole display panel is subjected to a greater stress when the bridges is bent, and thus a service life of the display panel is not long.

A region size and a thickness of each film layer in the drawings do not represent a real region size and a real thickness of the film layer, but are only schematic and are used to illustrate specific embodiments of the present disclosure.

Figure 1:
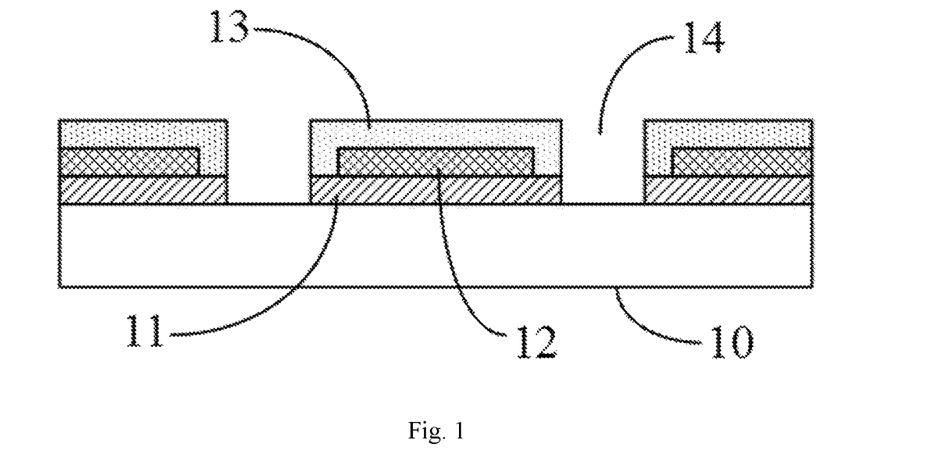
FIG. 1 is a schematic structural diagram of a display panel according to an embodiment of the present disclosure.

As shown in FIG. 1, a schematic structural diagram of a display panel according to an embodiment of the present disclosure is shown. The display panel includes multiple pixel units arranged in an array and a through hole 14 located between each two adjacent pixel units. The multiple pixel units include a flexible substrate 11, multiple thin film transistor structures 12 arranged in an array and an organic layer 13. The flexible substrate 11 is arranged on a rigid substrate 10; the thin film transistor structure 12 is located on the flexible substrate 11; and the organic layer 13 is located on the thin film transistor structure 12 and covers the thin film transistor structure 12.

As shown in FIG. 1, a through hole 14 is provided between each two adjacent thin film transistor structures 12, and the through hole 14 penetrates the organic layer 13 and the flexible substrate 11. The organic layer 13 covers an upper surface and two side surfaces of each thin film transistor structure 12. That is to say, an orthographic projection of the organic layer 13 onto the flexible substrate 11 is larger than an orthographic projection of the each thin film transistor structure 12 on the flexible substrate 11.

The display panel according to the embodiment of the disclosure includes a flexible substrate, multiple thin film transistor structures arranged in an array and an organic layer; in which, a through hole is arranged between each two adjacent thin film transistor structures, the through hole penetrates the organic layer and the flexible substrate, and the organic layer covers an upper surface and two side surfaces of each thin film transistor structure. Since each thin film transistor structure is completely surrounded by the organic layer and the flexible substrate, an inorganic layer of the each thin film transistor structure will not leak out, and an unstable interface with an organic property and an inorganic property will not be exposed at the through hole, thereby increasing stability of the thin film transistor structure. Accordingly, stability of a package can be improved during performing a subsequent encapsulation process.

In some optional embodiments, an orthographic projection of the through hole on the flexible substrate does not overlap with an orthographic projection of the thin film transistor structure on the flexible substrate, thus an inorganic layer of the thin film transistor structure is not exposed at the through hole, even over-undercut occurs during a patterning process of the through hole, thereby making the thin film transistor structure stable. In some optional embodiments, a side surface of the through hole 14 is perpendicular to a plane where the flexible substrate is located. Compared with a through hole with inclined side surfaces in the related art, the display panel in the embodiment reduces an invalid opening spacing between elements and realizes a high resolution.

In some optional embodiments, the organic layer 13 includes multiple organic layer patterns separated by the through holes 14, and each of the organic layer patterns is a U-shaped structure for surrounding an upper surface and two side surface of a thin film transistor structure 12 of a corresponding pixel unit.

The display panel in the embodiment of the present disclosure is described by taking a stretchable OLED display panel as an example, and the display panel is able to be stretched in at least one direction.

Specifically, the substrate base 10 in the embodiment of the present disclosure may be a glass substrate, a quartz substrate, or the like. The thin film transistor structure in the embodiment of the present disclosure includes multiple thin film transistors used as a drive circuit of the OLED display panel.

According to the embodiment of the disclosure, the through hole can be arranged between each two adjacent islands of the stretchable display panel, and the arrangement of the through hole can increase stretchability of the stretchable display panel.

A case where an unstable interface with an organic property and an inorganic property will not be existed at the through-hole in the embodiment of the present disclosure is introduced hereinafter in conjunction with a specific embodiment.

Figure 2:
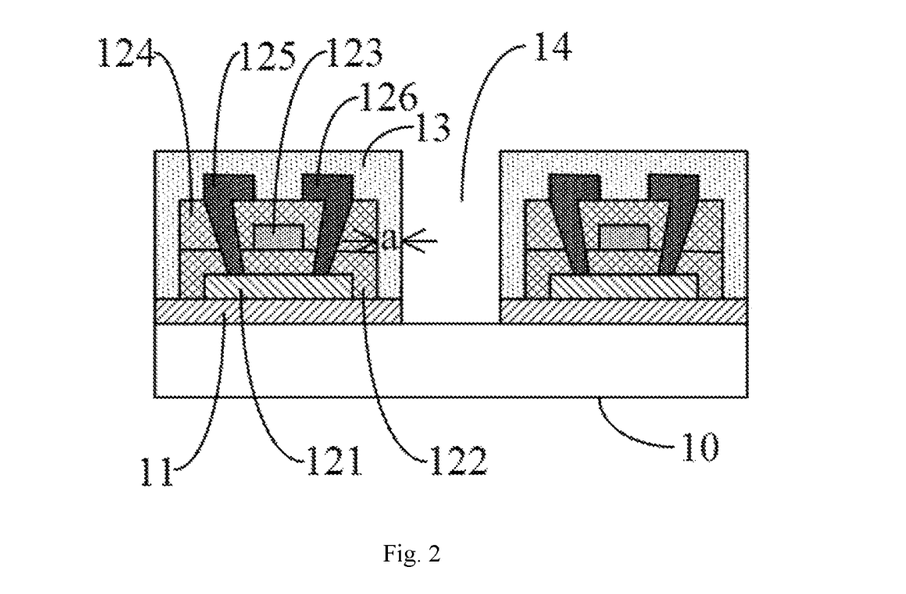
FIG. 2 is a schematic structural diagram of a display panel according to an embodiment of the present disclosure.

As shown in FIG. 2, it is shown that each thin film transistor structure 12 includes one thin film transistor, and the thin film transistor is a top gate type as an example. Each thin film transistor structure 12 includes a semiconductor active layer 121, an insulation layer 122, a gate electrode 123, a gate insulation layer 124, a source electrode 125, and a drain electrode 126. The insulation layer 122 and the gate insulation layer 124 are made of inorganic materials such as silicon oxide ($SiO_2$), silicon nitride (SiN) and the like.

As shown in FIG. 2, the insulation layer 122 and the gate insulation layer 124 are surrounded by the organic layer 13. Optionally, along a horizontal direction of FIG. 2, a distance a between a side surface of the organic layer 13 and a side surface of either of the insulation layer 122 or the gate insulation layer 124 is greater than 1 micron, an unstable interface with an organic property and an inorganic property will not be existed at the through hole 14, thereby increasing stability of the thin film transistor structure, and accordingly, a stability of a package can be improved during performing a subsequent encapsulation process. Since the unstable interface with the organic property and the inorganic property will not be existed at the through hole 14, an adhesive force between layers is prevented from being decreased due to a long-term contact with moisture, and an interlayer peeling caused by a long-time tensile stress can be avoided.

When the display panel in the embodiment of the present disclosure is a stretchable OLED display panel, there is a one-to-one correspondence between the thin film transistor structures and islands of the stretchable OLED display panel, and signal wires between islands is connected by a bridge. However, the inventors of the present disclosure found that when the display panel of this structure is stretched, the bridge is subjected to the largest stress, therefore, a structure with a high mechanical strength is required so as to increase a reliability of the stretchable OLED display panel.

Figure 3:
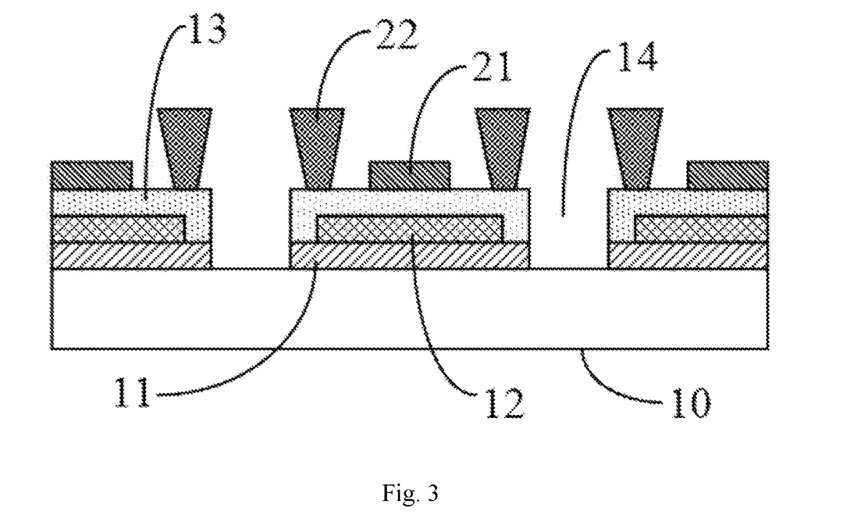
FIG. 3 is a schematic structural diagram of a display panel including a reinforcing element according to an embodiment of the present disclosure.

In some optional embodiments, as shown in FIG. 3, the display panel further includes multiple light-emitting structures 21 located on the organic layer 13 and multiple reinforcing elements 22 located on the organic layer 13. There is a one-to-one correspondence between the light-emitting structures 21 and the thin film transistor structures 12, and each reinforcing element 22 is located in a peripheral region of at least one thin film transistor structure 12. A peripheral region of each thin film transistor structure 12 is provided with multiple reinforcing elements 22.

In some optional embodiments, each light-emitting structure 21 includes an anode layer, a light-emitting layer, and a cathode layer. In an actual design, the light-emitting structure 21 may also include a hole transporting layer, an electron injecting layer, and the like. Each thin film transistor structure 12 supplies a driving voltage to the anode layer of each light-emitting structure 21.

Optionally, in a first direction (e.g., a vertical direction), a height of each reinforcing element 22 is larger than a height of each light-emitting structure 21.

Optionally, a material of each reinforcing element 22 includes an organic material, and a position where the reinforcing element 22 is located corresponds to a position of the through hole 14 (i.e., a wire region of the bridge). Optionally, multiple reinforcing elements 22 are evenly distributed on two sides of the organic layer, thus forming an I-beam structure (both sides of the bridge have a greater rigidity), thereby enhancing a structural strength on both sides of the bridge, enhancing a flexure strength of the bridge and further increasing a flexure strength of the display panel.

Figure 4:
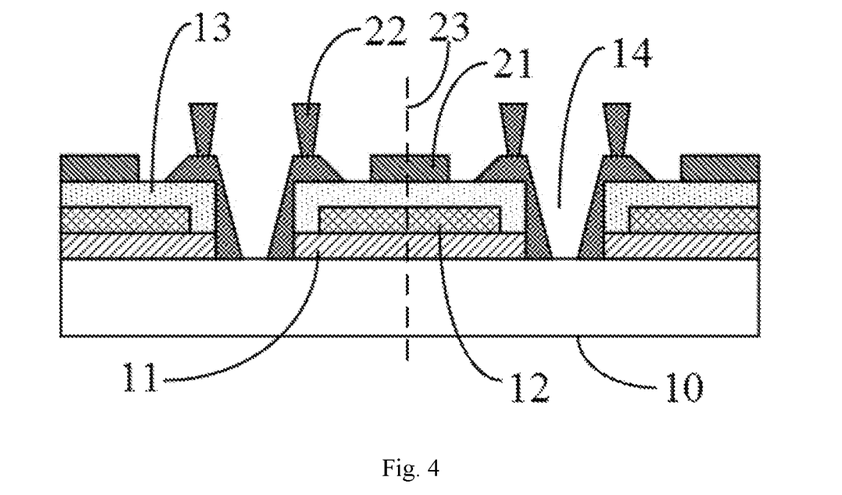
FIG. 4 is a schematic structural diagram of a display panel including a reinforcing element according to an embodiment of the present disclosure.

During the manufacturing process of the through hole 14, since an etching process is adopted, side walls of the organic layer 13 and the flexible substrate 11 may be uneven, and stress concentration points are generated on the uneven surface when the uneven surface is subjected to a stress, thus the display panel is easily damaged. In order to solve this problem, in some optional embodiments, reinforcing elements 22 cover side surfaces of the organic layer 13 and the flexible substrate 11 at the through hole 14, as shown in FIG. 4. The reinforcing element 22 can repair a flatness of the side walls of the organic layer 13 and the flexible substrate 11 and thus enhancing an anti-damage strength of the display panel.

In some optional embodiments, the reinforcing element 22 may only cover the side surface of the organic layer 13, and the reinforcing element 22 only repairs a flatness of the side wall of the organic layer 13, to increase an anti-damage strength of the display panel in a certain extent while simplifying the reinforcing element 22.

In some optional embodiments, reinforcing elements 22 corresponding to each thin film transistor structure 12 are symmetrically distributed about a central axis of the each thin film transistor structure 12. That is, for each thin film transistor structure 12, reinforcing elements 22 in a peripheral region of the thin film transistor structure 12 are symmetrically distributed about the central axis 23 of the thin film transistor structure 12. This makes a rigidity of a left side of the bridge consistent to a rigidity of a left side of the bridge, which can further enhance a flexure strength of the bridge.

As shown in FIG. 4, the reinforcing element 22 may be formed by laminating a positive trapezoid and an inverted trapezoid, and the present disclosure is not limited thereto.

Figure 5:
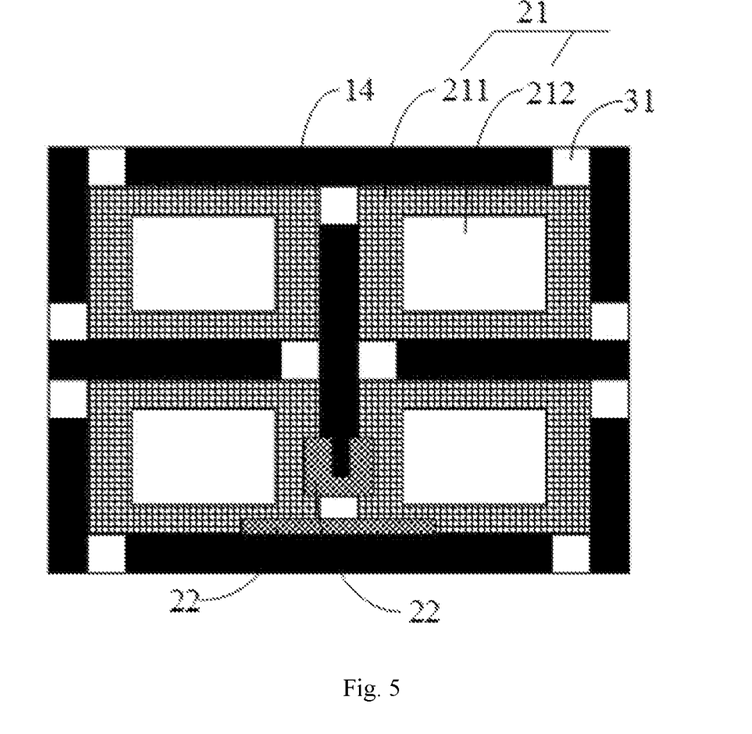
FIG. 5 is a schematic plan view of a display panel including a reinforcing element according to an embodiment of the present disclosure.

FIG. 5 is a schematic plan view of a display panel including a reinforcing element according to an embodiment of the present disclosure. As shown in FIG. 5, the light-emitting structure 21 includes a pixel defining layer 211 and a light-emitting layer 212. In the FIG. 5, a wire region of the bridge is indicated by 31, and a reinforcing element 22 is respectively arranged on two sides of the wire region 31.

In the embodiment of the present disclosure, the reinforcing element 22 may be an organic layer separately manufactured or may be manufactured using an organic thin film encapsulation layer in a subsequent encapsulation process. A position where the reinforcing element 22 of the present disclosure is arranged will be described in detail hereinafter in conjunction with several specific embodiments.

Figure 6A:
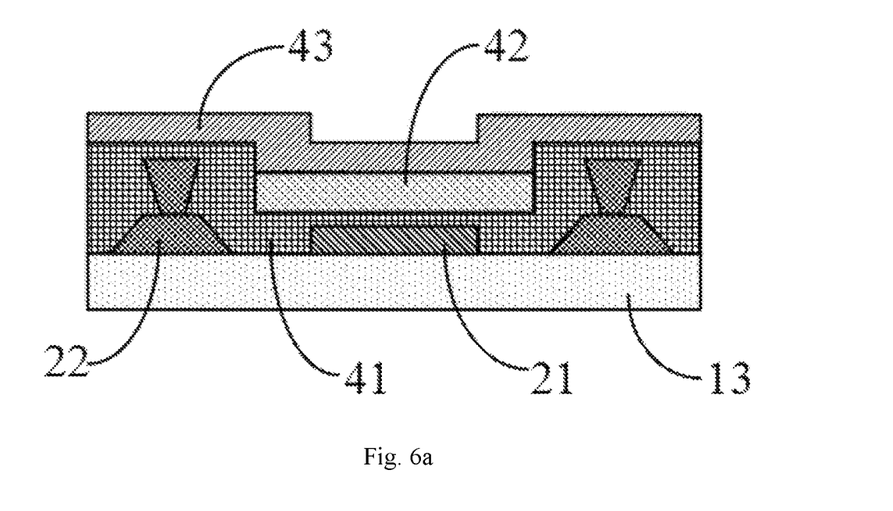
FIG. 6a is a structural schematic diagram of a reinforcing element according to an embodiment of the present disclosure.

As shown in FIG. 6a, a reinforcing element 22 is a separately manufactured organic layer, and the reinforcing element 22 has a structure in which a regular trapezoid and an inverted trapezoid are laminated. However, in an actual production process, the reinforcing element 22 may also be arranged in other shapes and the specific shape of the reinforcing element 22 is not limited in the embodiment of the present disclosure. Reinforcing elements 22 are located on the organic layer 13 and on two sides of the light-emitting layer 21. The display panel further includes a thin film encapsulation layer covering the light-emitting structure 21 and the reinforcing elements 22, and the thin film encapsulation layer includes a first inorganic thin film encapsulation layer 41, an organic thin film encapsulation layer 42, and a second inorganic thin film encapsulation layer 43 sequentially laminated.

In some optional embodiments, as shown in FIG. 6a, a side surface of the thin film encapsulation layer proximate to the through hole is perpendicular to the flexible substrate.

Figure 6B:
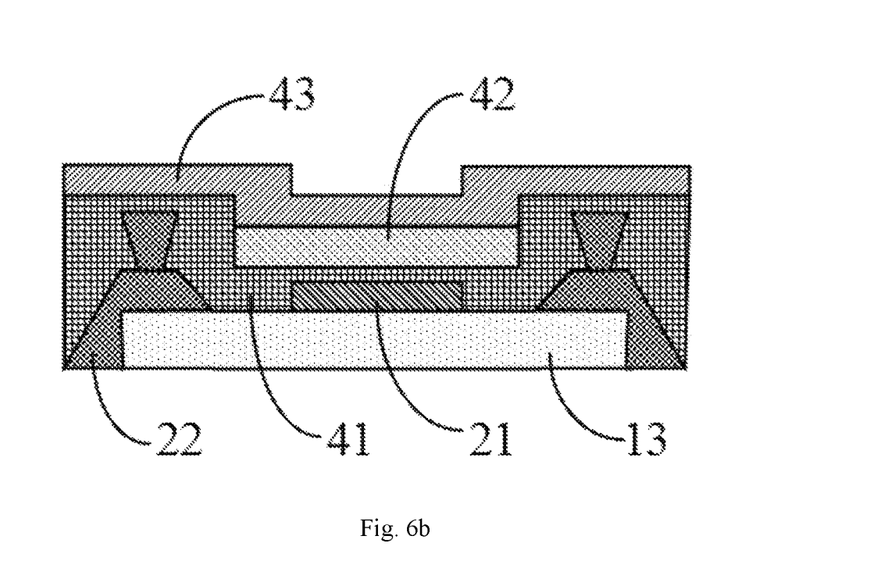
FIG. 6b is a structural schematic diagram of a reinforcing element according to an embodiment of the present disclosure.

As shown in FIG. 6b, the reinforcing element 22 is a separately manufactured organic layer. Different from the embodiment as shown in FIG. 6a, in this embodiment, the reinforcing element 22 covers a side surface of the organic layer 13 and thus the reinforcing element 22 can effectively repair a flatness of the side wall of the organic layer 13.

Figure 6C:
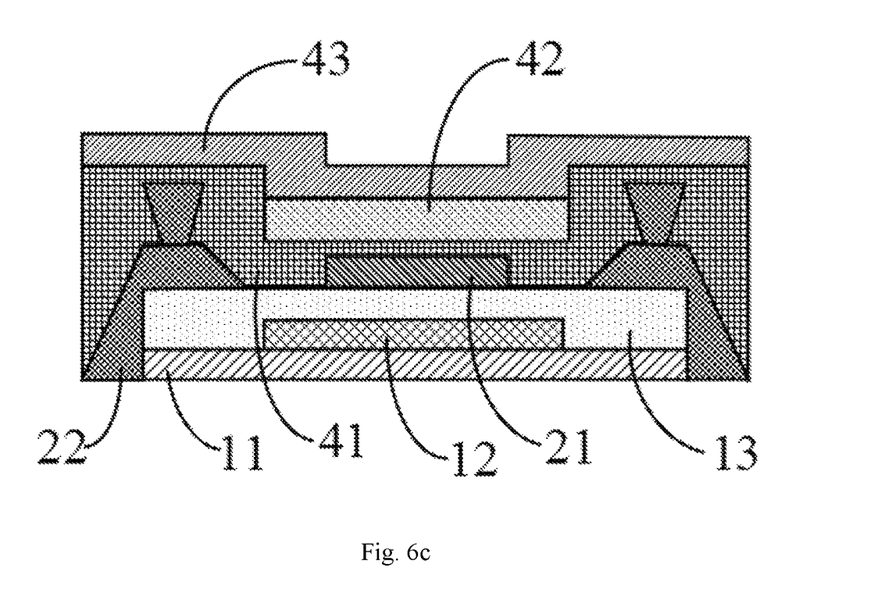
FIG. 6c is a structural schematic diagram of a reinforcing element according to an embodiment of the present disclosure.

As shown in FIG. 6c, the reinforcing element 22 adopts a separately manufactured organic layer, different from the embodiment as shown in FIG. 6b, in this embodiment, the reinforcing element 22 further covers both a side surface of the flexible substrate 11 and the side surface of the organic layer 13, therefore, the reinforcing element 22 can effectively repair a flatness of side walls of the organic layer 13 and the flexible substrate 11, and can further protect wires (e.g., source wires, drain wires, gate wires, etc.) contained in the thin film transistor structure 12 so as to prevent corrosion due to water vapor and oxygen.

Figure 6D:
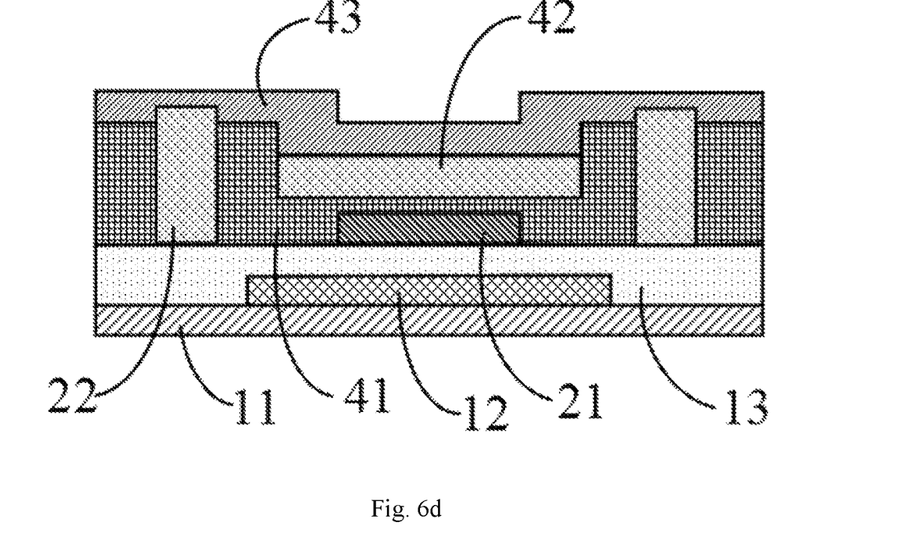
FIG. 6d is a structural schematic diagram of a reinforcing element according to an embodiment of the present disclosure.

As shown in FIG. 6d, the reinforcing element 22 is made of an organic thin film encapsulation layer, and the organic thin film encapsulation layer is arranged in a peripheral region of a thin film transistor structure 12, and specifically arranged on the organic layer 13. In an actual manufacturing process, a thickness of the organic thin film encapsulation layer serving as the reinforcing element 22 is thick enough to increasing flexure strength of the bridge.

Figure 6E:
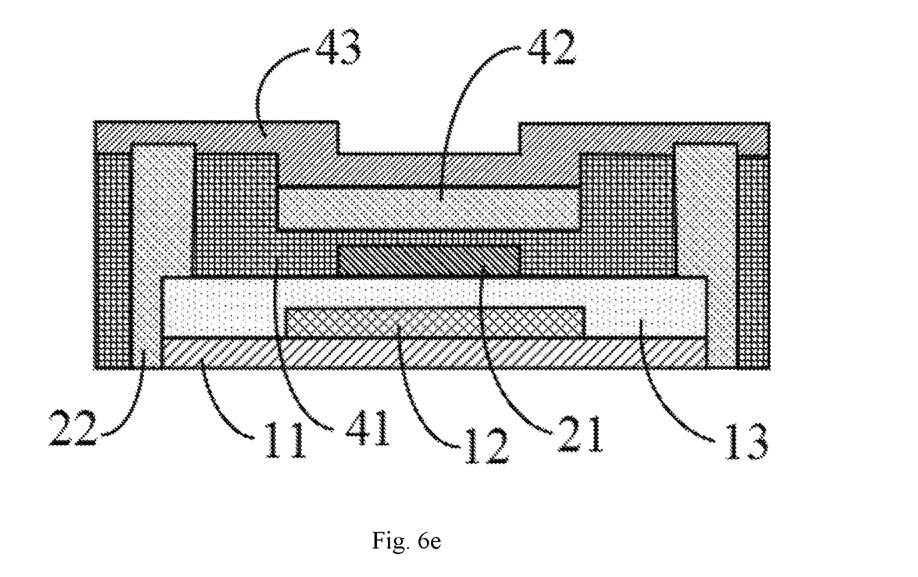
FIG. 6e is a schematic cross-sectional structural view of a reinforcing element according to an embodiment of the present disclosure.

As shown in FIG. 6e, the reinforcing element 22 is made of an organic thin film encapsulation layer. Different from the embodiment as shown in FIG. 6d, the reinforcing element 22 covers side surfaces of the organic layer 13 and the flexible substrate 11, therefore, the reinforcing element 22 can effectively repair a flatness of side walls of the organic layer 13 and the flexible substrate 11, and can achieve a good protective effect on wires contained in the thin film transistor structure 12.

Figure 7:
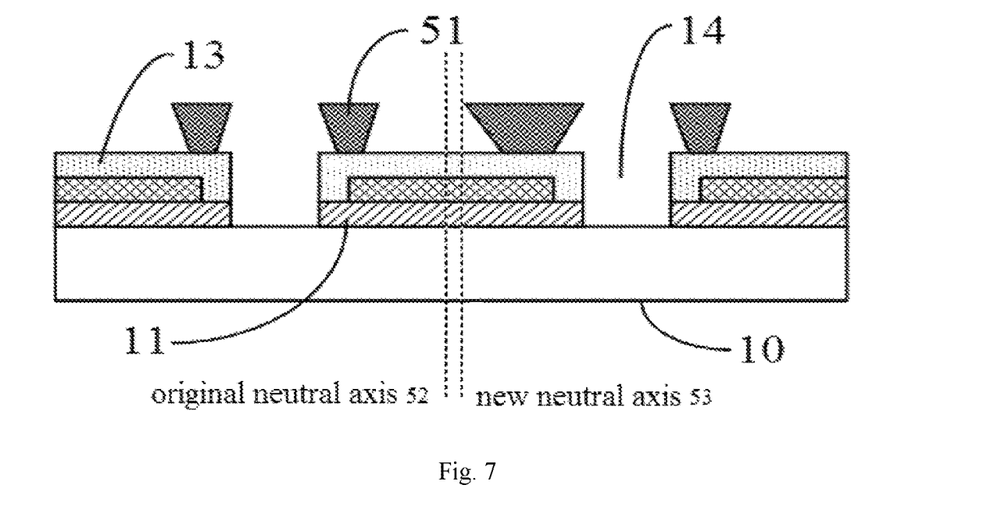
FIG. 7 is a structural diagram of a display panel including a convex structure according to an embodiment of the present disclosure.

In some optional embodiments, as shown in FIG. 7, the display panel further includes multiple convex structures 51 located on the organic layer 13, convex structures 51 corresponding to each thin film transistor structure 12 are asymmetrically disposed with respect to a neutral axis of the each thin film transistor structure 12 corresponding to the convex structures. The arrangement manner can change a position of a neutral axis of each pixel unit, can change a position of a neutral axis of the bridge, and can further change areas of an inner bending region and an outer bending region when the display panel is bent, for example, being stretched.

Figure 8:
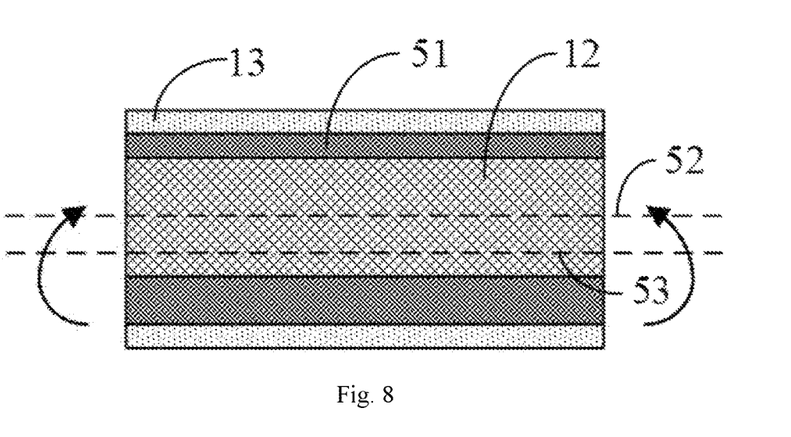
FIG. 8 is a schematic plan view of a display panel including a convex structure according to an embodiment of the present disclosure.

Specifically, the neutral axis refers to an intersection of a neutral layer and a cross section of a beam. In the case of plane bending and oblique bending, a normal stress value of each point on an intersection line between a cross section and a stress plane is zero, and the intersection line is called the neutral axis. For a structure formed from a uniform material or having a symmetrical shape, a neutral axis of the structure coincides with a neutral axis of the structure. Specifically, as shown in FIG. 8, a schematic plan view of a display panel including a convex structure 51 according to an embodiment of the present disclosure is shown, and an arrangement of the convex structure 51 of the embodiment of the present disclosure can change a position of a neutral axis of the bridge. As shown in FIGS. 7 and 8, when the convex structure 51 is not provided, an original neutral axis 52 of the bridge coincides with a neutral axis; after the convex structures 51 with different sizes are arranged on a left side and right side of the bridge respectively, a new neutral axis of the bridge 53 moves to the right side of the bridge relative to the central axis. Since a size of the convex structures on the right side is larger than a size of the convex structures on the left side, a center of gravity of the bridge moves to the right, that is to say, the arrangement of the multiple convex structures 51 can change a position of the neutral axis of the bridge. A direction indicated by arrows in FIG. 8 indicates a bending direction of the display panel. When the display panel is bent along the direction indicated by the arrows, a stress subjected at the neutral axis 53 is zero, while an inner bending region (i.e., a region above the neutral axis 53 in FIG. 8) of the display panel will be subjected to a compressive stress, and an outer bending region (i.e., a region below the neutral axis 53 in FIG. 8) will be subjected to a tensile stress.

In some optional embodiments, at least part of the wires contained in the thin film transistor structure is located in the inner bending region formed when the display panel is bent.

In some optional embodiments, all wires contained in the thin film transistor structure are located in the inner bending region formed when the display panel is bent. As a common inorganic material can bear a relative small tensile stress but can bear a relative large compressive stress, by arranging the wires in the inner bending region, a problem of an increasing resistance or even wire breakage of the wires caused by bending deformation for several times of the wires can be avoided.

In some optional embodiments, the display panel further includes multiple strain sensing wires for feeding back a bending degree of the display panel; the strain sensing wire is located in an outer bending region formed when the display panel is bent; the strain sensing wire can bear a relative small tensile stress, and if the strain sensing wire has a too large deformation to beyond a preset threshold, the bending degree of the display panel can be fed back in time to ensure that the wires contained in the thin film transistor structure is not damaged and protection of the display panel is achieved. Of course, in an actual design, the strain sensing wires can also feed back their deformation in real time, thus providing correction to a displayed image after stretching the stretchable display panel.

Specifically, in the embodiment of the present disclosure, the convex structure 51 may be located on a same layer as the reinforcing element 22, and the convex structure 51 may be a separately manufactured organic layer or may be formed by manufacturing an organic thin film encapsulation layer in a subsequent encapsulation process. An arrangement of the convex structure 51 of the present disclosure will be described in detail below in conjunction with several specific embodiments.

Figure 9A:
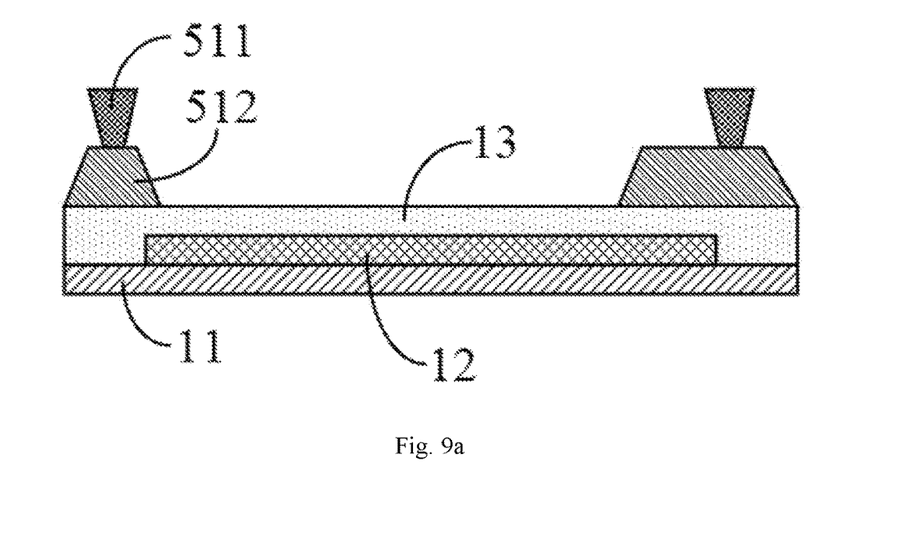
FIG. 9a is a schematic diagram of a display panel including a convex structure according to an embodiment of the present disclosure.

In some optional embodiments, as shown in FIG. 9a, the convex structure 51 may include a first organic layer 511 and a second organic layer 512, the first organic layer 511 and the second organic layer 512 are stacked. For thin film transistor structure 12, the first organic layer 511 may be symmetrically distributed about a neutral axis of the each thin film transistor structure 12, and the second organic layer 512 may be asymmetrically distributed about the neutral axis of the each thin film transistor structure 12. The asymmetric distribution may refer that a distance between the convex structure 51 at one side of the thin film transistor structure 12 and the central axis of the thin film transistor structure 12 is different from a distance between the convex structure 51 at the other side of the thin film transistor and the central axis of the thin film transistor structure 12, and/or that sizes or the numbers of the convex structures 51 on two side surfaces of the thin film transistor structure 12 are different. FIG. 9a shows that a distance between a second organic layer 512 on one side of the thin film transistor structure 12 and a central axis of the thin film transistor structure 12 is different from a distance between a second organic layer 512 on the other side of a thin film transistor structure 12 and the central axis of the thin film transistor structure 12 and the sizes of the second organic layer 512 on two side surfaces of the thin film transistor structure 12 are different.

In a specific implementation, the first organic layer 511 may be formed by using photoresist. A material of the second organic layer 512 may be the same as that of the pixel defining layer, and may be formed simultaneously with the pixel defining layer in a same process.

Figure 9B:
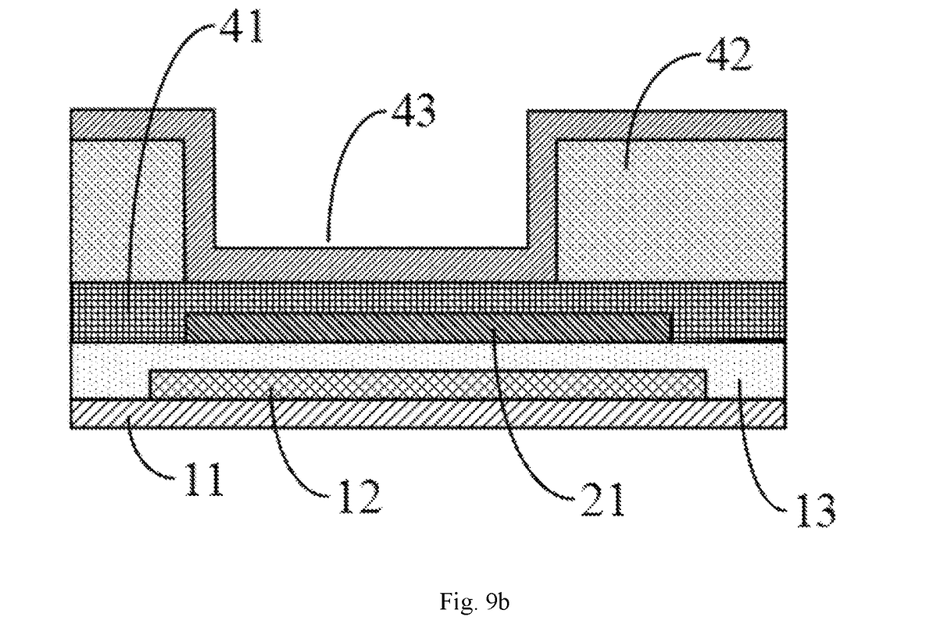
FIG. 9b is a schematic diagram of a display panel including a convex structure according to an embodiment of the present disclosure.

In some optional embodiments, as shown in FIG. 9b, the convex structure may be formed by using an organic thin film encapsulation layer 42, which is asymmetrically distributed about the neutral axis of the thin film transistor structure 12. With this arrangement manner, production time is saved and a production cost is reduced.

Figure 9C:
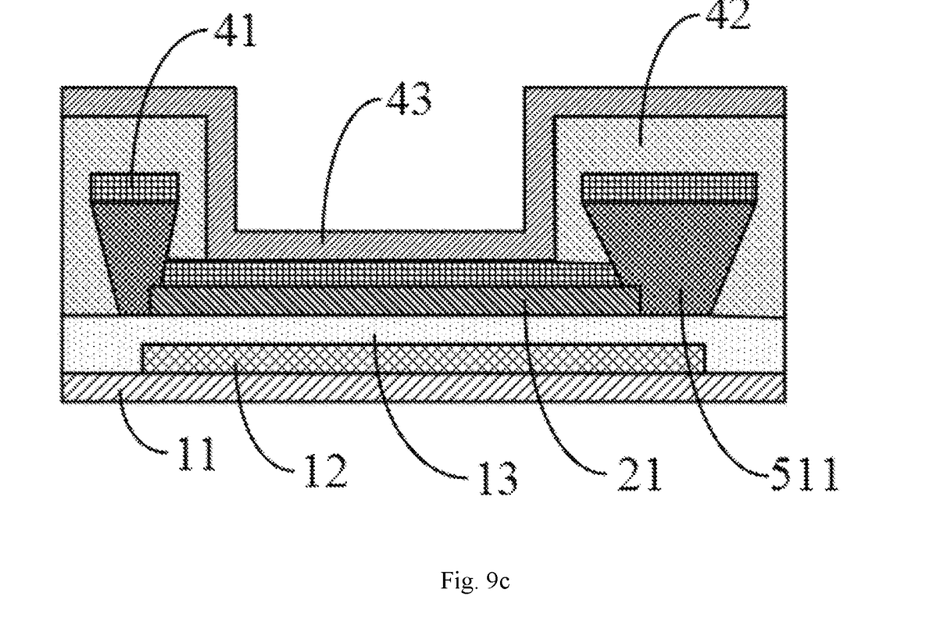
FIG. 9c is a schematic diagram of a display panel including a convex structure according to an embodiment of the present disclosure.

In some optional embodiments, as shown in FIG. 9c, the convex structure is formed by a first organic layer 511 and and an inorganic thin film encapsulation layer 41, and the formed convex structures are asymmetrically distributed about a neutral axis of the thin film transistor structure 12.

Based on the same inventive concept, the embodiment of the present disclosure further provides a display device, which includes the display panel provided according to each of the above embodiments of the present disclosure. The display device may be a display device such as a liquid crystal panel, a liquid crystal display, a liquid crystal television, an OLED panel, an OLED display, an OLED television or electronic paper.

Figure 10:
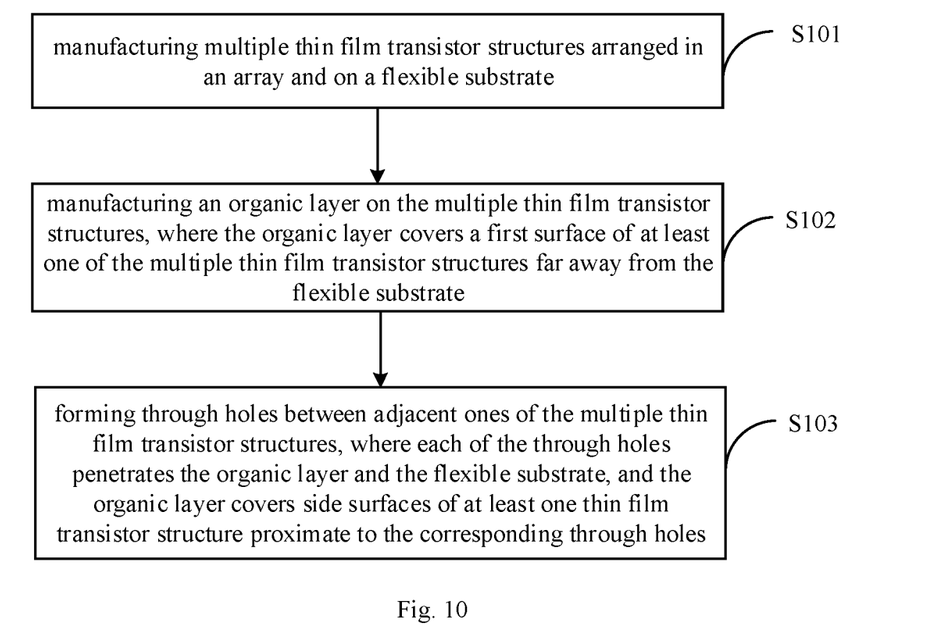
FIG. 10 is a flowchart of a method for manufacturing a display panel according to an embodiment of the present disclosure.

Based on the same inventive concept, an embodiment of the present disclosure also provides a method for manufacturing the display panel described above. As shown in FIG. 10, the method includes:

S101, manufacturing multiple thin film transistor structures arranged in an array and on a flexible substrate;

S102, manufacturing an organic layer on the multiple thin film transistor structures, where the organic layer covers a first surface of at least one of the multiple thin film transistor structures far away from the flexible substrate; and S103, forming through holes between adjacent ones of the multiple thin film transistor structures, where each of the through holes penetrates the organic layer and the flexible substrate, and the organic layer covers side surfaces of at least one thin film transistor structure proximate to the corresponding through holes.

Specifically, in the embodiment, after forming through holes between adjacent ones of the multiple thin film transistor structures, the method further includes: manufacturing multiple light-emitting structures on the organic layer, where there is a one-to-one correspondence between a light-emitting structure and a thin film transistor structure; and manufacturing a thin film encapsulation layer on the light-emitting structure, where the thin film encapsulation layer includes an inorganic thin film encapsulation layer and an organic thin film encapsulation layer alternately laminated.

The method for manufacturing the display panel according to the embodiment of the present disclosure will be described in detail hereinafter in conjunction with a specific embodiment.

Figure 11:
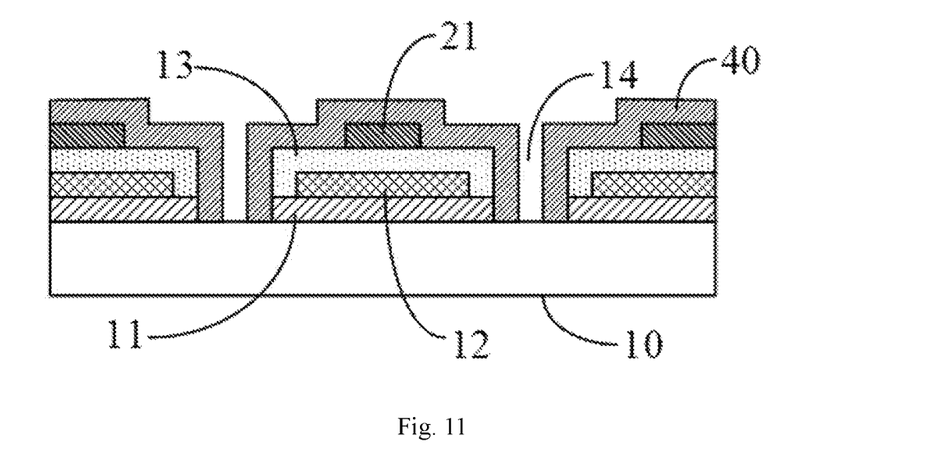
FIG. 11 is a schematic structural diagram of a display panel according to an embodiment of the present disclosure.

As shown in FIG. 11, a flexible substrate 11 is first manufactured on a flexible substrate 10. Specifically, the flexible substrate 11 can be manufactured by coating a Polyimide (PI) layer on the substrate 10.

Then, multiple thin film transistor structures 12 arranged in an array are manufactured on the flexible substrate 11.

In a specific embodiment, the thin film transistor structure 12 may be manufactured by a patterning process, and the thin film transistor structure 12 includes one or more thin film transistors.

An organic layer 13 is manufactured on the thin film transistor structure 12, and the organic layer 13 covers each thin film transistor structure 12. A specific method for manufacturing the organic layer 13 can refer to the related art. As shown in FIG. 11, the thin film transistor structure 12 is completely surrounded by the organic layer 13 and the flexible substrate 11, and the inorganic layer contained in the thin film transistor structure does not leak out, therefore, an unstable interface with an organic property and an inorganic property will not be existed at the through hole, thereby increasing stability of the thin film transistor structure. A through hole 14 is manufactured between each two adjacent thin film transistor structures 12, and the through hole 14 penetrates the organic layer 13 and the flexible substrate 11. A specific method for manufacturing the through hole 14 can refer to the related art. The difference is that since the organic layer 13 covers each thin film transistor structure 12 in the embodiment of the present disclosure, the inorganic layer included in the thin film transistor structure 12 is not required to be etched during the process of manufacturing the through hole 14. Furthermore, since etching selection ratios of different materials are different during the etching process, the under cut defect caused by the different etching selection ratios of the organic layer and the inorganic layer in the etching process is avoided in the embodiments of the present disclosure, and a reliability of display panel is further improved.

Multiple light-emitting structures 21 are manufactured on the organic layer 13, and there is a one-to-one correspondence between a light-emitting structure 21 and a thin film transistor structure 12.

A thin film encapsulation layer 40 is manufactured on the light-emitting structure 21, and the thin film encapsulation layer 40 may be a lamination structure of multiple inorganic thin film encapsulation layers and multiple organic thin film encapsulation layers that are alternately arranged.

In some optional embodiments, after forming through holes between adjacent ones of the multiple thin film transistor structures, the method further includes: manufacturing multiple reinforcing elements on the organic layer, where the multiple reinforcing elements are located in a peripheral region of at least one thin film transistor structure. The reinforcing elements can be formed by a patterning process, and the patterning process includes photoresist coating, exposure, development and the like. A specific structure of the reinforcing element has been described in detail in the embodiment of the device, which will not be repeated herein.

In some optional embodiments, the embodiment of the present disclosure further includes, after making a through hole between two adjacent thin film transistor structures, making multiple convex structures on the organic layer, where the convex structures are located in the peripheral region of at least one thin film transistor structure, and the multiple convex structures corresponding to each thin film transistor structure are asymmetrically distributed with respect to the neutral axis of the thin film transistor structure. The convex structure can be located on the same layer as the reinforcing element, and the convex structure may also be formed by patterning process. The specific structure of the convex structure has been described in detail in the device embodiment, and will not be described herein.

In summary, the display panel according to the specific embodiment of the present disclosure has the following advantages:

Firstly, the display panel according to the embodiments of the present disclosure includes a flexible substrate, a multiple thin film transistor structures arranged in an array, and an organic layer. A through hole is arranged between each two adjacent thin film transistor structures, the through hole penetrates the organic layer and the flexible substrate, and the organic layer covers an upper surface and the two side surfaces of each thin film transistor structure. Since each thin film transistor structure is completely surrounded by the organic layer and the flexible substrate, an inorganic layer of the each thin film transistor structure will not leak out, and an unstable interface with an organic property and an inorganic property will not be exposed at the through hole, thereby increasing stability of the thin film transistor structure. Accordingly, stability of a package can be improved during performing a subsequent encapsulation process. Since an orthographic projection of the through hole on the flexible substrate does not overlap with an orthographic projection of the thin film transistor structure onto the flexible substrate, thus over-undercut is avoided during a patterning process of the through hole, thereby stabilizing the thin film transistor structure.

Secondly, the display panel according to the embodiments of the present disclosure further includes multiple reinforcing elements located on the organic layer, the reinforcing elements are located in a peripheral region of at least one thin film transistor structure, and the arrangement of the reinforcing elements can increase a structural strength on both side surfaces of the bridge, thereby enhancing a flexure strength of the bridge and further enhancing a flexure strength of the display panel.

Thirdly, the reinforcing element of the embodiment of the present disclosure covers the side surfaces of the organic layer and the flexible substrate proximate to the through hole. This arrangement can repair repair a flatness of the side walls of the organic layer and the flexible substrate and thus enhance an anti-damage strength of the display panel.

Fourthly, the display panel according to the embodiments of the present disclosure further includes multiple convex structures located on the organic layer, the convex structures are located in the peripheral region of at least one thin film transistor structure, and the multiple convex structures corresponding to each thin film transistor structure are asymmetrically arranged about the neutral axis of the corresponding thin film transistor structure. The arrangement manner can change a position of the neutral axis of the thin film transistor structure, can change a position of the neutral axis of the bridge, and further can change the area of the inner bending region and the outer bending region formed when the display panel is bent, for example, stretched.

Fifthly, at least part of the wires contained in the thin film transistor structure in the specific embodiments of the present disclosure are located in an inner bending region formed when the display panel is bent; since an inorganic materials can bear a relative small tensile stress and can bear a relative great compressive stress, arranging of the wires in the inner bending region can avoid a problem of increasing of a wire resistance or even fracture of the wires due to bending deformation of the display panel several times.

Sixthly, the display panel according to the specific embodiments of the application further includes multiple strain sensing wires for detecting a bending degree of the display panel. The multiple strain sensing wire is located in an outer bending region formed when the display panel is bent. The strain sensing wire can bear a relative small tensile stress, and if the strain sensing wire has a large deformation, the bending degree of the display panel can be fed back in time to ensure that the wires contained in the thin film transistor structure is not damaged and protection of the display panel is achieved.

In the embodiments of the present disclosure, numbering of the steps does not necessarily define a sequence of the steps. Variation of the sequence of the steps also falls into the protection scope of the present disclosure for one of ordinary skills in the art on the premise of paying not creative work.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", or "comprising" and the like mean that an element or an article preceding the term contains elements or items and equivalents thereof behind the term, but does not exclude other elements or items. Such terms as "connected", or "interconnected" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" the another element, or there may exist an intervening element.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. A display panel, comprising:
   a flexible substrate;
   a plurality of thin film transistor structures arranged in an array and on the flexible substrate;
   an organic layer located on the plurality of thin film transistor structures; and
   a light-emitting structure located on a side of the organic layer away from the plurality of thin film transistor structures,
   wherein through holes are between adjacent ones of the plurality of thin film transistor structures, each of the through holes penetrates the organic layer and the flexible substrate, the organic layer comprises a plurality of organic layer patterns that are spaced apart from each other by the through holes, and the flexible substrate comprises a plurality of substrate patterns that are spaced apart from each other by the through holes,
   wherein the organic layer covers a first surface of at least one of the plurality of thin film transistor structures away from the flexible substrate, and covers side surfaces of the at least one thin film transistor structure proximate to the corresponding through holes, and
   wherein each of the plurality of thin film transistor structures comprises a semiconductor active layer, an insulation layer, a gate electrode, a gate insulation layer, a source electrode, and a drain electrode, the insulation layer is between the semiconductor active layer and the gate electrode,
   wherein the semiconductor active layer, the insulation layer, the gate electrode, the gate insulation layer, the source electrode, and the drain electrode of each thin film transistor structure are surrounded by a corresponding one of the plurality of organic layer patterns and a corresponding one of the plurality of substrate patterns, for each of the plurality of organic layer patterns, the organic layer directly contacts the insulation layer, and the organic layer pattern and the semiconductor active layer are spaced apart by the insulation layer.

2. The display panel according to claim 1, wherein a side surface of at least one of the through holes is perpendicular to the flexible substrate.

3. The display panel according to claim 1, wherein each of the plurality of the organic layer patterns is a U-shaped structure for surrounding a first surface and two side surfaces of a corresponding one of the plurality of thin film transistor structures.

4. The display panel according to claim 3, wherein each thin film transistor structure is provided with a plurality of reinforcing elements, and the plurality of reinforcing elements corresponding to the each thin film transistor structure is symmetrically distributed about a central axis of the each thin film transistor structure.

5. The display panel according to claim 4, further comprising: a plurality of convex structures on the organic layer; wherein a plurality of convex structures is on each thin film transistor structure, and the plurality of convex structures corresponding to the each thin film transistor structure are asymmetrically distributed about a neutral axis of the each thin film transistor structure.

6. The display panel according to claim 4, wherein at least part of wires comprised in each thin film transistor structure is located in an inner bending region formed when the display panel is bent.

7. The display panel according to claim 6, further comprising a strain sensing wire for detecting a bending degree of the display panel, wherein the strain sensing wire is located in an outer bending region formed when the display panel is bent, and the inner bending region and the outer bending region are separated by the neutral axis.

8. The display panel according to claim 3, wherein each of the plurality of organic layer patterns is in direct contact with a first surface and two side surfaces of a corresponding one of the plurality of thin film transistor structures.

9. The display panel according to claim 1, further comprising: a plurality of reinforcing elements on the organic layer, wherein the plurality of reinforcing elements is in a peripheral region of at least one of the plurality of thin film transistor structures.

10. The display panel according to claim 9, wherein the plurality of reinforcing elements covers a side surface of the organic layer in the through holes, or cover a side surface of the organic layer in the through holes and a side surface of the flexible substrate in the through holes.

11. The display panel according to claim 10, wherein an orthographic projection of the organic layer onto the flexible substrate overlaps the flexible substrate.

12. The display panel according to claim 9, wherein each of the plurality of reinforcing elements is made of organic material, and wherein the plurality of reinforcing elements corresponding to each thin film transistor structure are separated from each other and are distributed on two sides of a corresponding one of the plurality of organic layer patterns.

13. The display panel according to claim 9, wherein each of the plurality of reinforcing elements comprises a positive truncated pyramid and an inverted truncated pyramid stacked in a direction perpendicular to the substrate.

14. The display panel according to claim 1, further comprising an encapsulation layer on the organic layer, wherein the encapsulation layer covers surfaces of the light-emitting structure and the organic layer away from the flexible substrate, and covers a side surface of the flexible substrate proximate to the through holes, and a side surface of the organic layer proximate to the through holes.

15. The display panel according to claim 14, wherein the side surface of the encapsulation layer proximate to the through holes is perpendicular to the flexible substrate, and the encapsulation layer comprises an inorganic thin film encapsulation layer and an organic thin film encapsulation layer alternately stacked.

16. A display device, comprising the display panel according to claim 1.

17. A method for manufacturing, a display panel, comprising:

manufacturing a plurality of thin film transistor structures arranged in an array and on a flexible substrate;

manufacturing an organic layer on the plurality of thin film transistor structures, wherein the organic layer covers a first surface of at least one of the plurality of thin film transistor structures away from the flexible substrate;

forming through holes between adjacent ones of the plurality of thin film transistor structures, wherein each of the through holes penetrates the organic layer and the flexible substrate, and the organic layer covers side surfaces of the at least one thin film transistor structure proximate to the corresponding through holes; and forming a light-emitting structure on a side of the organic layer away from the plurality of thin film transistor structures, wherein the organic layer comprises a plurality of organic layer patterns that are spaced apart from each other by the through holes, and the flexible substrate comprises a plurality of substrate patterns that are spaced apart from each other by the through holes, and wherein each of the plurality of thin film transistor structures comprises a semiconductor active layer, an insulation layer, a gate electrode, a gate insulation layer, a source electrode, and a drain electrode, the insulation layer is between the semiconductor active layer and the gate electrode, wherein the semiconductor active layer, the insulation layer, the gate electrode, the gate insulation layer, the source electrode, and the drain electrode of each thin film transistor structure are surrounded by a corresponding one of the plurality of organic layer patterns and a corresponding one of the plurality of substrate patterns, for each of the plurality of organic layer patterns, the organic layer pattern directly contacts the insulation layer, and the organic layer pattern and the semiconductor active layer are spaced apart by the insulation layer.

18. The method according to claim 17, wherein after forming the through holes between adjacent ones of the plurality of thin film transistor structures, the method further comprises:

manufacturing a plurality of reinforcing elements on the organic layer, wherein the plurality of reinforcing elements is in a peripheral region of at least one of the plurality of thin film transistor structures.

19. The method according to claim 17, wherein after forming the through holes between adjacent ones of the plurality of thin film transistor structures, the method further comprises:

manufacturing a plurality of convex structures on the organic layer, wherein the plurality of convex structures is in a peripheral region of at least one of the plurality of thin film transistor structure, and a plurality of convex structures corresponding to each thin film transistor structure is asymmetrically distributed about a neutral axis of the each thin film transistor structure.

* * * * *